(12) United States Patent
Hayashi et al.

(10) Patent No.: US 7,211,867 B2
(45) Date of Patent: May 1, 2007

(54) THIN FILM MEMORY, ARRAY, AND OPERATION METHOD AND MANUFACTURE METHOD THEREFOR

(75) Inventors: Yutaka Hayashi, Ibaraki (JP); Hisashi Hasegawa, Chiba (JP); Yoshifumi Yoshida, Chiba (JP); Jun Osanai, Chiba (JP)

(73) Assignees: Seiko Instruments Inc. (JP); Yutaka Hayashi (JP)

( * ) Notice: Subject to any disclaimer, the term of this patent is extended or adjusted under 35 U.S.C. 154(b) by 40 days.

(21) Appl. No.: 10/879,938

(22) Filed: Jun. 28, 2004

(65) Prior Publication Data

US 2005/0001269 A1 Jan. 6, 2005

(30) Foreign Application Priority Data

| Apr. 10, 2002 | (JP) | ............................ 2002-106423 |
| Aug. 7, 2002 | (JP) | ............................ 2002-230397 |
| Mar. 27, 2003 | (JP) | ............................ 2003-066898 |

(51) Int. Cl.
*H01L 27/01* (2006.01)

(52) U.S. Cl. ........................ 257/351; 257/71; 257/318; 257/908

(58) Field of Classification Search ................ 365/181; 257/900–902, 905–906, 71, 318, 320, 351
See application file for complete search history.

(56) References Cited

U.S. PATENT DOCUMENTS

| 4,330,849 A | * | 5/1982 | Togei et al. ................. 365/181 |
| 5,283,457 A | | 2/1994 | Matloubian ................. 257/35.1 |
| 5,578,853 A | * | 11/1996 | Hayashi et al. .............. 257/351 |
| 5,784,311 A | * | 7/1998 | Assaderaghi et al. ........ 365/150 |
| 6,111,778 A | * | 8/2000 | MacDonald et al. ........ 365/149 |

FOREIGN PATENT DOCUMENTS

| EP | 0601590 | 6/1994 |
| JP | 58093370 | * 6/1983 |

OTHER PUBLICATIONS

Patent Abstracts of Japan, vol. 0112, No. 12 (E-522), publication No. 62035559, publication date Feb. 19, 1987.
Patent Abstracts of Japan, vol. 0071, No. 90 (E-164), publication No. 58093370, publication date Jun. 3, 1983.

* cited by examiner

*Primary Examiner*—Hoai Pham
*Assistant Examiner*—John Ingham
(74) *Attorney, Agent, or Firm*—Adams & Wilks

(57) ABSTRACT

A memory cell which is formed on a fully depleted SOI or other semiconductor thin film and which operates at low voltage without needing a conventional large capacitor is provided as well as a memory cell array. The semiconductor thin film is sandwiched between first and second semiconductor regions which face each other across the semiconductor thin film and which have a first conductivity type. A third semiconductor region having the opposite conductivity type is provided in an extended portion of the semiconductor thin film. From the third semiconductor region, carriers of the opposite conductivity type are supplied to and accumulated in the semiconductor thin film portion to change the gate threshold voltage of a first conductivity type channel that is induced by a first conductive gate voltage in the semiconductor thin film between the first and second semiconductor regions through an insulating film.

61 Claims, 9 Drawing Sheets

THIN FILM MEMORY, ARRAY, AND OPERATION METHOD AND MANUFACTURE METHOD THEREFOR

BACKGROUND OF THE INVENTION

1. Field of the Invention

The present invention relates to a semiconductor memory and an integrated circuit built therefrom, and more specifically, to a technique which uses for a channel formation region a semiconductor thin film such as SOI (Semiconductor On Insulator) or SON (Semiconductor On Nothing). The semiconductor thin film is formed on an insulating substrate (SOI) in some cases, is suspended and held at both ends by substrates in a hollow state (SON) in some other cases, and has a projecting portion which is connected at one end to a substrate in still other cases.

2. Description of the Related Art

H. J. Wann et al. have proposed in 1993 to obtain a dynamic memory that does not use a capacitor by incorporating two complementary transistors in a partially depleted SOIMOS transistor structure (See Non-patent Document 1, for example).

Recently, a memory has been proposed in which carriers are generated utilizing a carrier multiplication phenomenon such as avalanche breakdown in a drain high electric field region of a partially depleted SOIMOS transistor and the obtained carriers are used to charge a neutral body, resulting in a change in current flowing between the drain and the source of the transistor (See Non-patent Document 2, for example).

The term partially depleted SOI, abbreviated as PD SOI, refers to SOI in which a depletion layer spreads only partially in the depth direction of its semiconductor thin film to give it a neutral region. 'Body' is a simplified term for the above semiconductor thin film in which a channel is formed.

[Non-Patent Document 1]
H. J. Wann, C. Hu, "A capacitor-less DRAM cell on SOI substrate", 1993, IEDM (International Electron Device Meeting) Technical Digest, pp. 635–638

[Non-Patent Document 2]
S. Okhonin et al., "A Capacitor-less 1T-DRAM Cell", IEEE Electron Device letters, Volume 23, Number 2, pp. 85–87, February 2002

On the other hand, fully depleted (FD) SOI is used for low power consumption uses or for advanced miniaturization of SOIMOS transistor, thereby creating the need for SOI memory cells that can be applied to FDSOI. The term FD (fully depleted) SOI refers to SOI having such thickness and impurity concentration that makes the depletion layer cover the entire depth of the semiconductor thin film under some gate bias of a transistor fabricated there.

The method of utilizing carrier multiplication in a drain high electric field portion also causes carrier multiplication of a small degree in a not-selected cell which is connected to a bit line for driving at high voltage a drain of a cell to which a signal is to be written. This leads to erroneous, albeit mild, writing called 'write disturb' and therefore makes it difficult to assemble a large array in which a large number of cells are connected to each bit line. Furthermore, the method also needs a relatively large current, which prevents parallel programming of a large number of the cells.

SUMMARY OF THE INVENTION

The present invention has been made in view of the above, and an object of the present invention is therefore to provide a capacitor-less SOI or other semiconductor thin film memory cell and memory cell array which are applicable to FDSOI. Another object of the present invention is to provide an SOI or other semiconductor thin film memory cell and memory cell array in which data is written or erased without using carrier multiplication in a drain high electric field portion, as well as an operation method and manufacture method for the memory cell and array.

To attain the above objects, the present invention employs a method of supplying carriers from a third semiconductor region, which is not a drain nor a source, (1) to a body (2) without using carrier multiplication in a drain high electric field portion.

DETAILED DESCRIPTION OF THE PREFERRED EMBODIMENTS

Embodiment Mode

Figure 1:
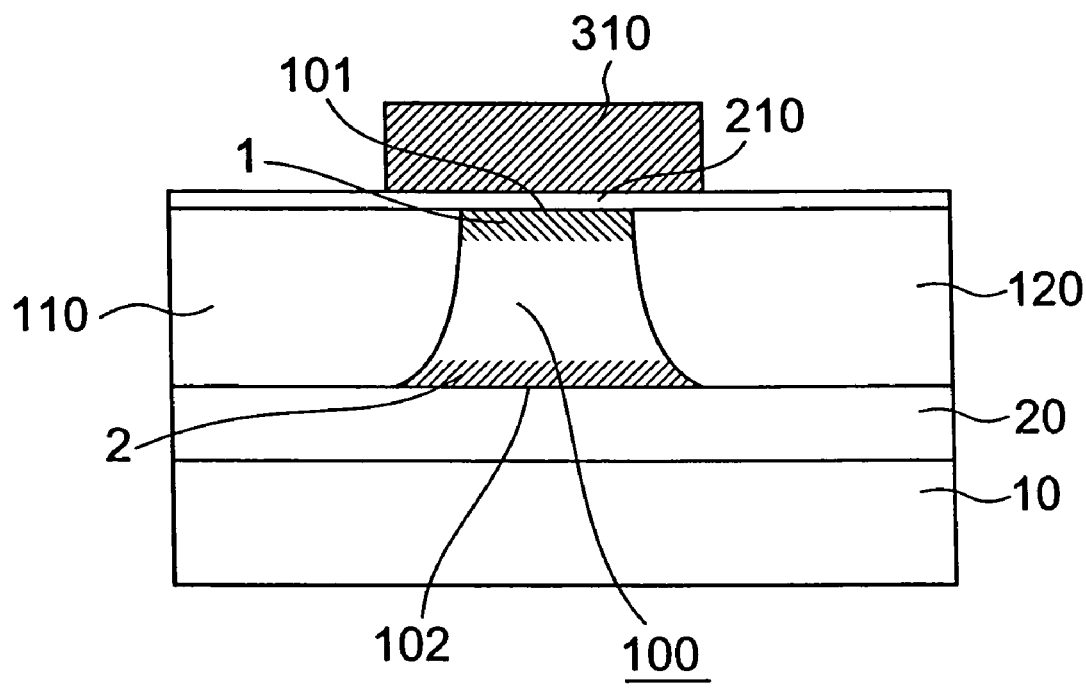
FIG. 1 is a sectional view showing a principle of the present invention.
Figure 2A:
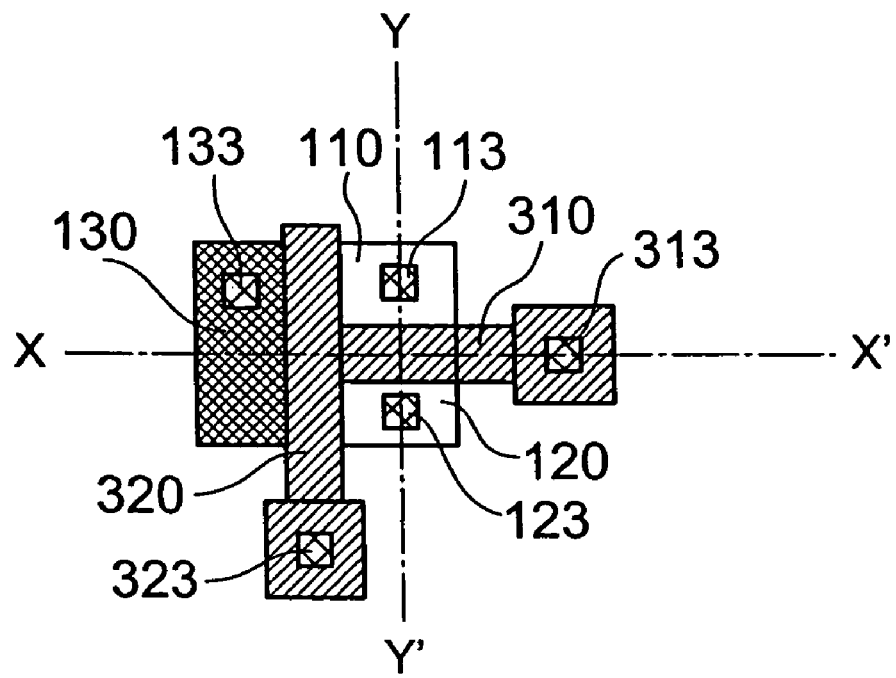
FIGS. 2A and 2B are a plan view showing an embodiment of the present invention and a sectional view thereof, respectively.
Figure 2B:
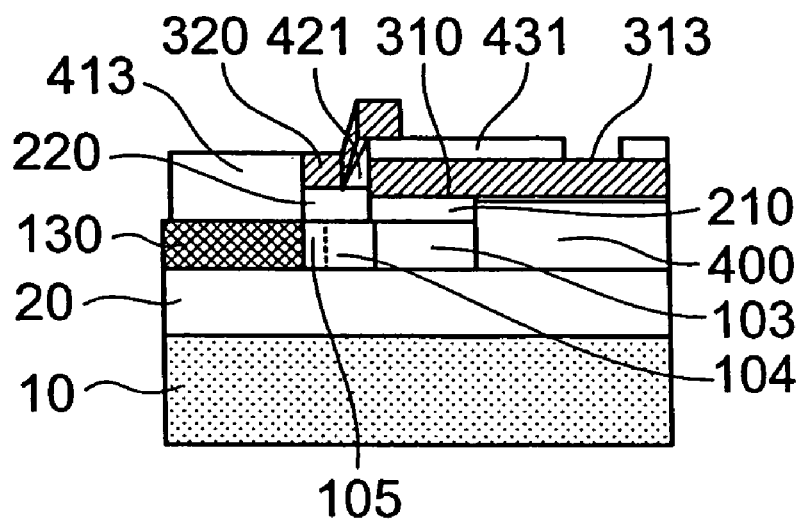

A memory cell of the present invention is shown in FIG. 1 and FIGS. 2 and 2B. FIG. 1 is an example of a sectional view thereof. FIG. 2A is an example of a plan view thereof and FIG. 2B is a sectional view taken along the line X–X' of FIG. 2A. As shown in these drawings, the memory cell includes:

a semiconductor thin film 100 having a first principal surface 101 and a second principal surface 102 that faces the first principal surface;

a first gate insulating film 210 formed on the first principal surface of the semiconductor thin film;

a first conductive gate 310 formed on the first gate insulating film;

a first semiconductor region 110 and a second semiconductor region 120 which are spaced apart from each other across the first conductive gate, which are insulated from the first conductive gate, which are in contact with the semiconductor thin film 100, and which have a first conductivity type; and a third semiconductor region 130 which has the opposite conductivity type and which is in contact with the semiconductor thin film.

The semiconductor thin film 100 has such a combination of thickness and impurity concentration relation that there exists an electric potential of the first conductive gate which causes depletion of carriers between the first principal surface 101 and the second principal surface 102 between the first and second semiconductor regions below the first conductive gate.

In the memory cell provided by the present invention, the semiconductor thin film is extended to the third semiconductor region 130 from a semiconductor thin film portion which is sandwiched between the first semiconductor region 110 and the second semiconductor region 120 and which is denoted by 103, and on the extended portion of the semiconductor thin film which is denoted by 104, a second gate insulating film 220 is formed and a second conductive gate 320 is formed on the second gate insulating film 220.

In FIGS. 2A and 2B, reference symbol 421 represents an inter-gate insulating film which is provided, if necessary, to insulate the first conductive gate and the second conductive gate which overlap each other. Denoted by 400 is a so-called field insulating film. 413 and 431 represent an insulating film formed on the third semiconductor region and an insulating film on the first conductive gate, respectively. 113, 123, 133, 313, and 323 are provided, if necessary, to serve as contacts leading to the first second, and third semiconductor regions and contacts leading to the first and the second conductive gates. FIG. 1 corresponds to a sectional view taken along the line Y–Y' in FIG. 2A. It is not always necessary for each cell to have the above contacts. In particular, a contact leading to a conductive gate can be shared among a large number of cells since a conductive gate often constitutes a part of a word line.

A first conductivity type channel is induced in the semiconductor thin film portion 103 that is sandwiched between the first semiconductor region 110 and the second semiconductor region 120 by an electric potential exceeding the gate threshold voltage of the first conductive gate. In the present invention, the semiconductor thin film portion 103 is called a first channel formation semiconductor thin film portion.

In the semiconductor thin film extended portion 104, carriers of the opposite conductivity type are induced, or a channel for carriers of the opposite conductivity type is formed by an electric potential difference between the second conductive gate and the third semiconductor region. The extended portion 104 is referred to in the present invention as a second channel formation semiconductor thin film portion and is disposed in direct contact with the first channel formation semiconductor thin film portion. A portion 105 which is different in conductivity type or impurity concentration from the other extended portion 104 may be formed in the extended portion 104 in order to adjust the gate threshold voltage of the opposite conductivity type carrier channel which is viewed from the second conductive gate. In the present invention, the above expression 'electric potential exceeding the gate threshold voltage' means an electric potential whose absolute value is larger than the gate threshold voltage in the positive direction if the transistor is an n-channel transistor and an electric potential whose absolute value is larger than the gate threshold voltage in the negative direction if the transistor is a p-channel transistor.

The distance between the first principal surface and the second principal surface is called in the present invention as the thickness of the semiconductor thin film.

By a first combination of an electric potential of the second conductive gate and an electric potential of the third semiconductor region, carriers 2 of the opposite conductivity type are injected from the third semiconductor region through the second channel formation semiconductor thin film portion into the first channel formation semiconductor thin film portion to change into a first value $Vth_{11}$ the gate threshold voltage of the first conductivity type channel in the first channel formation semiconductor thin film portion which is viewed from the first conductive gate into a first value $Vth_{11}$. This operation is called 'writing' in the present invention.

According to the first combination of the electric potentials, a value obtained by subtracting the electric potential of the third semiconductor region from the electric potential of the second conductive gate exceeds a gate threshold voltage $Vth_{2r}$ of the channel that is induced in the second channel formation semiconductor thin film portion to deliver the opposite conductivity type carriers from the third semiconductor region. $Vth_{2r}$ is the gate threshold voltage viewed from the second conductive gate.

With carriers of the opposite conductivity type injected to the first channel formation semiconductor thin film portion, a gate voltage necessary for the first conductive gate to induce the first conductivity channel is reduced by a level corresponding to the number of or the electric charges of the injected carriers of the opposite conductivity type. This means that the gate threshold voltage has shifted toward the depletion side equivalently. If the gate threshold voltage changes in an enhancement type range, it means that the absolute value of the gate threshold voltage is reduced.

The first electric potential combination allows multilevel setting. For example, on the premise that a value obtained by subtracting the electric potential of the third semiconductor region from the electric potential of the second conductive gate sufficiently exceeds a gate threshold voltage $Vth_{2r}$, which is viewed from the second conductive gate, of the channel that is induced in the second channel formation semiconductor thin film portion to deliver the opposite conductivity type carriers from the third semiconductor region, the electric potential of the third semiconductor region with respect to the gate electric potential is set to multilevel. This makes it possible to change the gate threshold voltage of the first conductive channel which is viewed from the first conductive gate into multilevel values $Vth_{11}$, $Vth_{12}$, $Vth_{13}$ . . . for writing. In short, this makes it possible to store plural bit information in one cell.

The opposite conductivity type carriers 2 injected into the first channel formation semiconductor thin film portion gradually diminish because of recombination with carriers of the first conductivity type or efflux from the first channel formation semiconductor thin film portion due to self-field. Accordingly, it is necessary to read the amount of opposite conductivity carriers accumulated in the first channel formation semiconductor thin film portion and re-write based on the readout. This is called 'refreshing'.

By a second combination of an electric potential of the second conductive gate and an electric potential of the third semiconductor region, the carriers 2 of the opposite conductivity type are drawn into the third semiconductor region from the first channel formation semiconductor thin film portion to change the gate threshold voltage of the first conductivity type channel in the first channel formation semiconductor thin film portion which is viewed from the first conductive gate into a second value $Vth_{10}$. This operation is called 'erasing' in the present invention.

According to the second combination of the electric potential relation, a value obtained by subtracting the electric potential of the opposite conductivity type carriers injected into the first channel formation semiconductor thin film portion from the electric potential of the second conductive gate exceeds the gate threshold voltage $Vth_{2r}$ of the opposite conductivity type channel in the second channel formation semiconductor thin film portion which is viewed from the second conductive gate.

Alternatively, the erasing operation is achieved by giving an electric potential of a direction that attracts carriers of the opposite conductivity type to the first or second semiconductor region (or instance, 0.6 V or higher in the negative direction for holes). In this case, carries of the first conductivity type are also supplied to the first channel formation semiconductor thin film portion to accelerate a decrease of carriers of the opposite conductivity type through recombination. In this erasing operation, data is erased from every cell whose second semiconductor region or first semiconductor region is connected to a common line or bit line.

Information stored in a memory cell of the present invention is judged by whether or not carriers of the opposite conductivity type are stored in the first channel formation semiconductor thin film portion of the memory cell or from the stored amount. To judge stored information in this way, the voltage of the first conductive gate with respect to the second semiconductor region is set to a prescribed value that exceeds one or both of the first gate threshold voltage and the second gate threshold voltage and whether a current flowing between the first semiconductor region and the second semiconductor region is large or small is detected ('small' including zero). For instance, the voltage of the first conductive gate with respect to the second semiconductor region is set to a level between the first gate threshold voltage and the second gate threshold voltage and whether or not a current flows between the first semiconductor region and the second semiconductor region is detected to judge the stored information.

In the case where multilevel of first gate threshold voltages are written, the voltage of the first conductive gate is set to a level between any two out of those levels to identify the stored data. Alternatively, the voltage of the first conductive gate with respect to the second semiconductor region is set to a voltage that exceeds both the first gate threshold voltage and the second gate threshold voltage and the stored information is judged from the amount of current flowing between the first semiconductor region and the second semiconductor region.

For detection of the current, a known method such as comparative detection using a reference current and a comparator circuit, or detection by time constant of charging or discharging a bit line or a bit line with additional capacitance can be employed. This operation is called 'reading'.

Through the reading operation, the electric potential of the valence band or conduction band in the energy band of the first channel formation semiconductor thin film portion is moved in a direction that eliminates carriers of the opposite conductivity type. In addition, a large amount of first conductivity type carriers are supplied to the first channel formation semiconductor thin film portion to accelerate recombination of the opposite conductivity type carriers stored in the first channel formation semiconductor thin film portion and to cause information loss in some cases. In this case, the refreshing operation has to be conducted immediately after the reading.

The semiconductor thin film 100 in FIG. 1 is supported by a substrate 10 having an insulating layer 20 formed on its surface. In most cases, the substrate 10 is formed of silicon and the insulating layer 20 is a silicon oxide film. The supporting substrate that has an insulating layer on its surface is called an insulating substrate. An insulating substrate that is entirely formed of an insulating material, such as a quartz substrate, can also serve as the supporting substrate. An alternative structure is that at least one end of the semiconductor thin film, or an end of the first semiconductor region, the second semiconductor region, or the third semiconductor region, is supported by a substrate.

Figure 3:
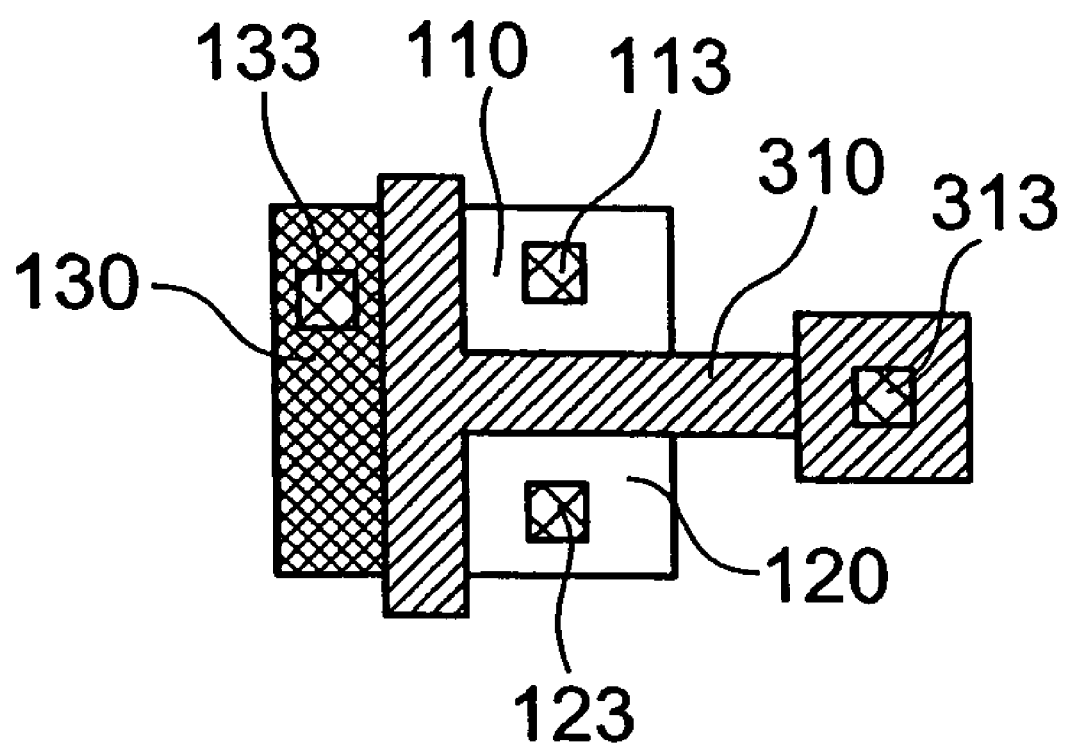
FIG. 3 is a plan view showing another embodiment of the present invention in which a first conductive gate and a second conductive gate are continuous.

In the present invention, if voltages of the first conductive gate and the second conductive gate during the writing, erasing, and reading operations are chosen carefully, a common voltage for both the first and second conductive gate can be used for each operation mode. Then the first and second conductive gates can be made continuous or shared as FIG. 3 shows its example. Furthermore, the same material and thickness can be employed for the gate insulating films. As a result, the number of manufacture steps and the area the cell occupies are reduced. In this case, by replacing the 'second conductive gate' in the description on the writing and erasing operations of the present invention with the 'first conductive gate', it becomes possible to realize the writing and erasing operations.

It is also possible in the present invention to write the first gate threshold voltage value under a certain condition and the second gate threshold voltage value under another condition. For example, the first gate threshold voltage is written when a value obtained by subtracting the electric potential of the third semiconductor region from the electric potential of the second conductive gate sufficiently exceeds a gate threshold voltage $Vth_{2r}$ of the channel that is induced in the second channel formation semiconductor thin film portion to deliver the opposite conductivity type carriers from the third semiconductor region which is viewed from the second conductive gate while the electric potential of the third semiconductor region is biased forward with respect to the electric potential of the second semiconductor region On the other hand, the second gate threshold voltage is written (equals to erasing) when the electric potential of the third semiconductor region is zero-biased or biased backward with respect to the second gate voltage.

Figure 4A:
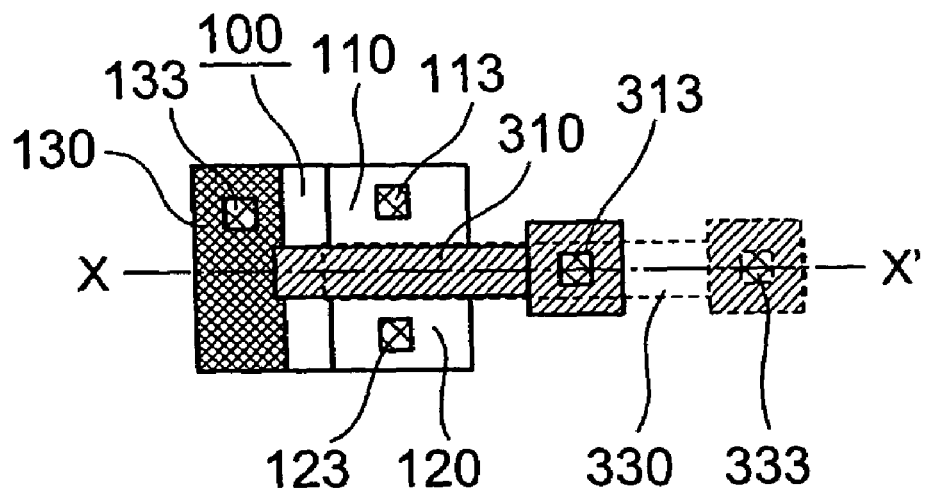
FIGS. 4A and 4B are a plan view and a sectional view, respectively, showing another embodiment of the present invention in which a third conductive gate is placed on a second principal surface of a semiconductor thin film.
Figure 4B:
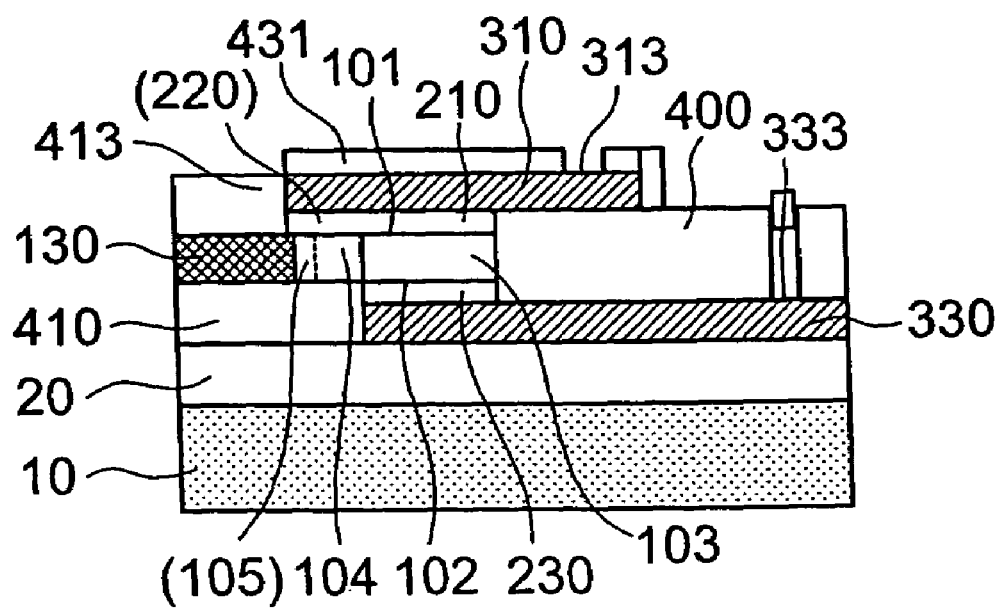

Another mode of a preferred memory cell for effectively carrying out the present invention is a memory cell shown in FIGS. 4A and 4B. The memory cell is characterized by including at least:

a semiconductor thin film (broken into portions 103 and 104) having a first principal surface 101 and a second principal surface 102 that faces the first principal surface;

a first gate insulating film 210 formed on the first principal surface of the semiconductor thin film;

a first conductive gate 310 formed on the first gate insulating film;

a first semiconductor region 110 and a second semiconductor region 120 which are spaced apart each other across the first conductive gate, which are insulated from the first conductive gate, which are in contact with the semiconductor thin film, and which have a first conductivity type;

a third semiconductor region 130 which has the opposite conductivity type and which is in contact with the semiconductor thin film;

a third gate insulating film 230 formed on the second principal surface of the semiconductor thin film portion (first channel formation semiconductor thin film portion) 103 that is sandwiched between the first semiconductor region and the second semiconductor region; and a third conductive gate 330 which is in contact with the third gate insulating film 230. The semiconductor thin film portion 104 is also called as a second channel formation semiconductor thin film portion in the present invention.

Carriers of the opposite conductivity type are stably stored in the first channel formation semiconductor thin film portion if the third conductive gate is given an electric potential exceeding a gate threshold voltage $Vth_{2r}$, which is the gate threshold voltage viewed from the third conductive gate with respect to opposite conductivity type carriers induced in the first channel formation semiconductor thin film portion. However, the refreshing operation is necessary in this case too, for carriers of the opposite conductivity type are gradually generated and stored in the first channel formation semiconductor thin film portion by thermal excitation, slight carrier multiplication in normal electric field, and the like after the erasing operation.

FIG. 4A is a plan view of the thin film memory cell of the above embodiment and FIG. 4B is a sectional view taken along the dot-dash line X–X' of the plan view of FIG. 4A. In FIGS. 4A and 4B, reference symbol 10 denotes a supporting substrate and 20, an insulating film on a surface of the supporting substrate 10. Denoted by 103 and 104 are the first and second channel formation semiconductor thin film portions, respectively, which are a part of the semiconductor thin film 100. 210 and 220 represent gate insulating films formed on the semiconductor thin film portions 103 and 104. The gate insulating films 210 and 220 in the drawing are continuous. Denoted by 310 is the first conductive gate, which is also continuous from the second conductive gate. 110 and 120 are the first and second semiconductor regions, respectively. 130 denotes the third semiconductor region.

113 and 123 represent wiring contacts leading to the first and second semiconductor regions, respectively. 133 represents a wiring contact leading to the third semiconductor region. Denoted by 400 is a so-called field insulating film which is placed under an interconnection film or the like. 431 denotes an insulating film placed on the first conductive gate, and 410, an insulating film placed between the semiconductor thin film 100 and the insulating film 20. 313 denotes a wiring contact leading to the first conductive gate. 333 denotes a wiring contact provided, if necessary, to lead to the third conductive gate.

It is not always necessary for each cell to have the above contacts. In particular, a contact leading to a conductive gate can be shared among a large number of cells since a conductive gate often constitutes a part of a word line. An impurity region 105 is not always necessary if the electric field of the third conductive gate influences the portion 104 less than the portion 103 (in other words, if the third conductive gate does not overlap the portion 130 as shown in FIG. 4B or if the third conductive gate overlaps the portion 130 while an insulating film thicker than the film 230 is sandwiched between the two).

In the embodiment modes described above, the first and second conductive gates can have different gate threshold voltages if the conductivity type of an impurity or impurity concentration of the second channel formation semiconductor thin film portion, or the second conductive gate material is different from the conductivity type of an impurity or impurity concentration of the first channel formation semiconductor the film portion, or the first conductive gate material. Opposite conductivity type carriers injected to the second channel formation semiconductor thin film portion is prevented from flowing back to the third semiconductor region if the gate threshold voltage of the second conductive gate with respect to the channel for opposite conductivity type carriers from the third semiconductor region is set to a level further in the enhancement type direction than the gate threshold voltage of the first conductive gate.

Embodiments

Figure 5A:
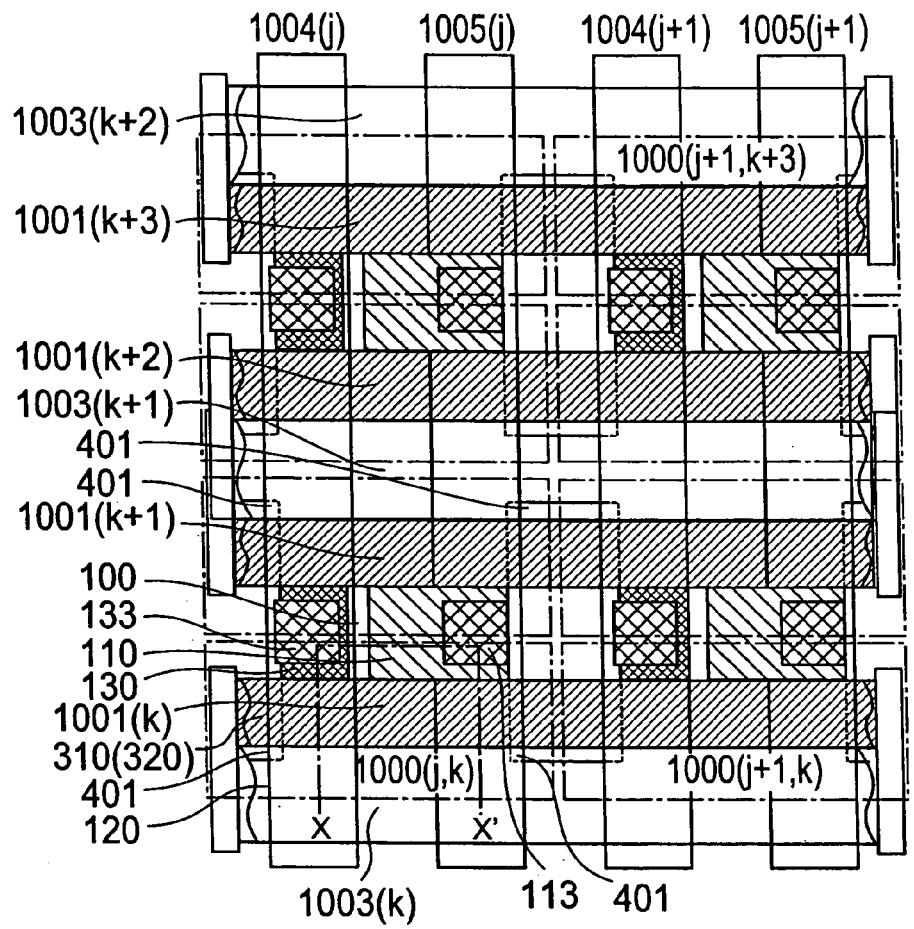
FIGS. 5A and 5B are a plan view of an embodiment in which memory cells of the present invention are arranged and connected to form an array structure and a sectional view of a cell portion, respectively.
Figure 5B:
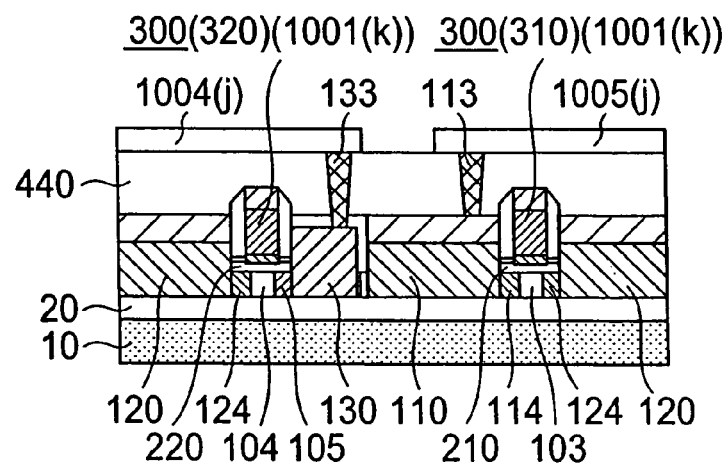

Described below is the memory cell operation of when the first conductivity type is the n type and the opposite conductivity type is the p type. The principles and effects given in the following description also apply to the case where the first conductivity type is the p type, although polarity and the direction of changes is reversed. FIG. 5A is a plan view of an embodiment of memory cells of the present invention and an array of the memory cells. FIG. 5B is a sectional view taken along the dot-dash line X–X' of the plan view of FIG. 5A.

Reference symbol 10 denotes a supporting substrate, which, in this example, is an n type silicon <100> plane wafer of high resistance. Denoted by 20 is a silicon oxide film with a thickness of about 100 nm. 103 represents a semiconductor thin film about 30 nm in thickness which serves as a first channel formation semiconductor thin film portion of a thin film memory cell 1000 of this embodiment. 104 represents a second channel formation semiconductor thin film portion. 105 represents a high impurity concentration portion in the second channel formation semiconductor thin film portion. 110 represents a drain (first semiconductor region). 114 is a drain extension. 120 is a source (second semiconductor region). 124 represents a source extension. 130 is a third semiconductor region of the opposite conductivity type. 210 is a first gate nitrided oxide film with a thickness of 2.7 nm. 220 is a second gate nitrided oxide film. 310 and 320 are a first conductive gate and a second conductive gate that is continuous from the first conductive gate. (300 is a symbol as a conductive gate thin film. 1001 is a functional symbol as a local word line.)

210 and 220 are continuous gates. The first conductive gate is about 100 nm in length and, in this embodiment, is formed from a silicon thin film doped with boron. The first, second, and third semiconductor regions include a semiconductor film that is formed by epitaxial growth on the semiconductor thin film. The first and second channel formation semiconductor thin film portions 103 and 104 in one cell are separated from the first and second channel formation semiconductor thin film portions 103 and 104 in an adjacent cell by a separation insulating film 401.

Denoted by 113 is a contact leading to the first semiconductor region, and the contact is connected to a reading bit line 1005. 113 represents a contact leading to the third semiconductor region and the contact is connected to a writing bit line 1004. The continuous first and second conductive electrodes 310 (320) are continuously extended between cells in the word direction, thereby forming a local word line 1001. The second semiconductor region is extended between cells in the word direction, thereby forming a local common line 1003. The local word line and the local common line are extended as long as the direct resistance does not affect the array operation, and are respectively connected to a global word line and a global common line through a selection transistor or directly. In a large capacity array, the above two types of bit lines are also connected to their respective global bit lines through a selection transistor.

In the array arrangement of FIG. 5A, cells 1000 are repeatedly arranged with a mirror image relation in the bit direction. As a result, the contacts 113 and 133 are shared between cells adjacent to each other in the bit direction. The first and third semiconductor regions are continued from a cell to its adjacent cell in one way of the bit direction whereas the second semiconductor region is continued from a cell to its adjacent cell in the other way in the bit direction. The array area is thus reduced. FIG. 5A shows two cells in the word direction and four cells in the bit direction, eight cells in total (a cell 1000 (j, k), . . . , a cell 1000 (j+1, k+3)). The mirror image arrangement of cells is also employed in an embodiment of FIG. 8 which will be described later.

A manufacture process of this embodiment is described below with reference to sectional views of FIGS. 6A to 6G and FIG. 5B.

(a) A high resistivity silicon wafer is used as a supporting substrate 10 and a silicon oxide film 20 with a thickness of about 100 nm and a silicon thin film 100 which has an n type impurity concentration of about $2 \times 10^{17}$ atoms/cc and which has a thickness of about 35 nm are layered on the substrate to prepare an SOI substrate.

(b) On the thus obtained SOI, an oxide film 41 is let grow until it reaches a thickness of about 7 nm by thermal oxidation and a silicon nitride film 42 with a thickness of about 50 nm is formed thereon by CVD. Thereafter, a photoresist pattern 51 is formed by known photolithography to protect necessary portions of the silicon thin film such as regions where memory cells are connected in the word direction and the bit direction, selection transistor regions, and peripheral circuit regions.

(c) Using the photoresist pattern 51 as a mask, the silicon nitride film is etched under etching conditions that provide a selective ratio with respect to the silicon oxide film to leave the silicon oxide film. The photoresist pattern is then removed and the substrate surface is cleaned. The exposed surface of the silicon oxide film which is exposed by the removal of the silicon nitride film is oxidized by pyrogenic oxidation until a silicon oxide film 401 grows to a thickness of about 60 nm. Through this step, the silicon thin film 100 is divided into pieces leaving the necessary portions given in the above, Alternatively, a known STI (shallow trench isolation) technique may be used to divide the silicon thin film. An insulating film for dividing the silicon thin film in the planar direction is called an insulating separation film 401.

The silicon nitride film 42 is removed by a hot phosphoric acid-based etchant and the silicon oxide film 41 is removed by a buffer hydrofluoric acid-based etchant to expose the surface of the silicon thin film 100.

A silicon oxide film 200 is formed on the surface of the silicon win film 100 by thermal oxidation to a thickness of 2.7 nm. Thereafter, ECR (Electron Cyclotron Resonance), ICP (Inductively Coupled Plasma), or like other high density plasma apparatus is used for surface nitridation at a nitridation ratio of 5 to 7% by introducing nitrogen radical from plasma of nitrogen gas, hydrogen gas, or xenon gas to the substrate surface and setting the substrate temperature to 400° C. Then the substrate is transferred in a highly pure nitrogen gas atmosphere and subjected to heat treatment at 800° C. in nitrogen to anneal surface defects. The silicon oxide film thus nitrided is used as the first and second gate oxide films.

(d) Next, a conductive gate thin film 300 is formed by deposition. For the first 10 nm or so, pure silicon is deposited to form a pure silicon thin film 301. Then a boron-doped silicon thin film 302 is formed by deposition to a thickness of 200 nm. The material gases used are mono-silane ($SiH_4$) and di-borane ($B_2H_6$). A silicon nitride film 43 is formed thereon by deposition to a thickness of about 100 nm. Ion implantation may be employed as an alternative method for the above boron doping.

Using a known technique such as ArF lithography or electron beam lithography, a gate-shaped photoresist pattern for a conductive gate/local word line having a gate length of about 100 nm is formed on the above silicon nitride film/conductive gate thin film. The photoresist pattern is used as a mask to etch the silicon nitride film and the conductive gate thin film in order by a RIE technique.

A photoresist film shaped by photolithography and the silicon nitride film/conductive gate thin film are used as selection masks to selectively form, by ion implantation at low acceleration voltage (about 15 KeV for arsenic), an extension region (114) of the n type drain (the first semiconductor region) and an extension region (124) of the source (the second semiconductor region). In the implantation, the dose is set so as to obtain an impurity concentration of about $1 \times 10^{19}$ atoms/cc (which is about $3 \times 10^{13}$ atoms/$cm^2$).

Similarly, a photoresist film shaped by photolithography and the silicon nitride film/conductive gate thin film are used as selection masks to selectively implant arsenic in the portion that forms the third semiconductor region at a dose of about $8.5 \times 10^{12}$ atoms/cc. A high impurity concentration region 105 is thus formed in the second channel formation semiconductor thin film portion so that it is in contact with the third semiconductor region formed in the subsequent step. This shift the gate threshold voltage $Vth_{2r}$ of the channel for holes from, the third semiconductor region which is viewed from the second conductive gate to the enhancement side.

(e) Using a known gate side wall insulating film process, insulating film side walls 403 each having a thickness of about 30 nm are formed on the side faces of the first and second conductive gates. The side walls are a two-layer laminate consisting of a silicon nitride film 404 with a thickness of about 7 nm and a silicon oxide film 405 with a thickness of about 23 nm. At this stage, the silicon nitride film 404 is left on the semiconductor thin film.

Lithography is used to form a photoresist pattern having an opening in the portion where the third semiconductor region is to be formed. A portion of the silicon nitride film 404 under the opening is etched by RIE. Then the photoresist is removed and a residual silicon oxide film in the opening is subjected to wet etching, followed by hydrogen termination.

Figure 6A:
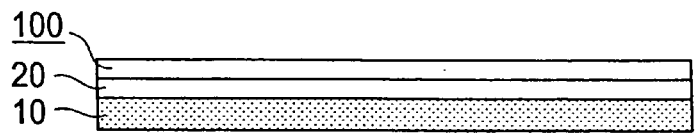
FIGS. 6A to 6G are sectional views showing an example of a process of manufacturing the memory cells and array of the embodiment shown in FIGS. 5A and 5B.
Figure 6B:
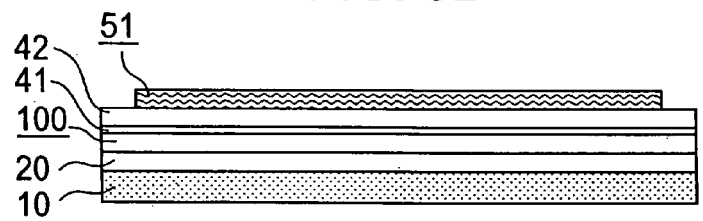
Figure 6C:
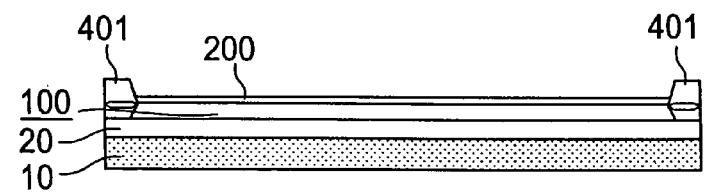
Figure 6D:
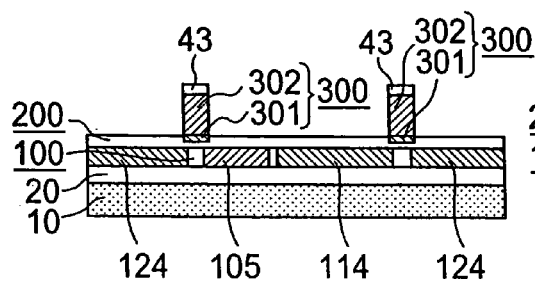
Figure 6E:
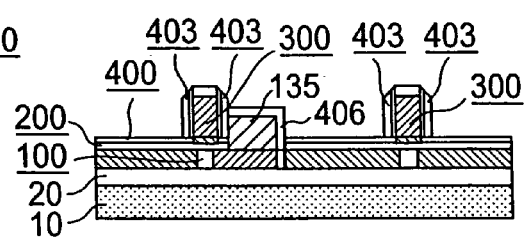
Figure 6F:
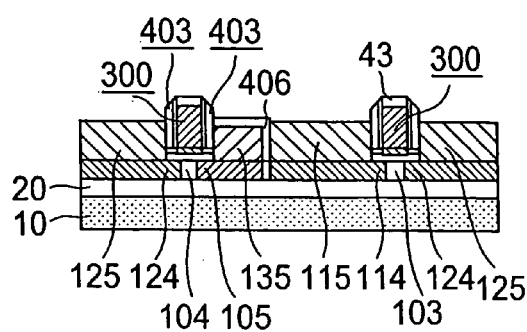
Figure 6G:
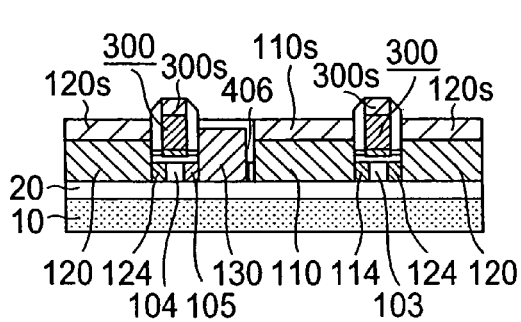

A boron-doped silicon crystal film 135 is selectively grown in the opening until it reaches a thickness of about 100 nm. The boron concentration is about $4 \times 10^{19}$ atoms/cc. Through thermal oxidation at 850° C., an oxide film 406 with a thickness of about 30 nm is let grow on the top and side faces of the p type silicon crystal film. In actuality, boron is diffused at this point from the silicon crystal film 135 into the semiconductor thin film 100 to give a portion of the semiconductor thin film that is under 135 the p type conductivity. In FIG. 6E, the portion is distinguished from the silicon crystal film selectively grown.

(f) The silicon nitride film 404 left on the memory cell portions of the semiconductor thin film 100 is etched by RIE. The silicon oxide film remaining on the etching surface is subjected to wet etching and then hydrogen termination is conducted. In etching the silicon nitride film, a portion of the silicon nitride film is excluded which is under the oxide film 406 on the side face of the crystal thin film that has been selectively grown to form the semiconductor region 130.

Arsenic-doped silicon crystal films 115 and 125 are selectively grown in the opening to a thickness of about 100 nm each. The arsenic concentration is about $5 \times 10^{20}$ atoms/cc. The oxide film 406 on the side face separates the p type high impurity concentration silicon crystal film 135 from the n type high impurity concentration silicon crystal films 115 and 125.

Instead of the above selective crystal growth, selective ion implantation using as masks a photoresist pattern and the conductive gate thin film and the silicon nitride film thereon may be employed to form the first, second, and third semiconductor regions.

During the crystal growth and subsequent heating step, the impurities of these silicon crystal films obtained through the selective crystal growth are diffused into the semiconductor thin film 100 starting from points where the crystal films and the semiconductor thin film meet. As a result, the third semiconductor region 130, the first semiconductor region 110, and the second semiconductor region 120 are formed at the same time the silicon crystal thin films are formed by selective crystal growth.

(h) The silicon nitride film 43 on the conductive gate thin film (300) is subjected to wet etching by hot phosphoric acid or the like. The surface is then rinsed, nickel is deposited by evaporation to a thickness of about 20 nm, and next follows sintering. The nickel on the insulating film that has not reacted is etched by an acid to leave a nickel silicide layer. Through high temperature sintering, a silicide layer 110s is formed on the first semiconductor region (drain), a silicide layer 120s is formed on the second semiconductor region (source), and a silicide layer 300s is formed on the gate thin film.

A silicon oxide film is formed as a interlayer insulating film 440 for interconnection by CVD on the surface. Contact holes are opened in the film as needed and contact plugs 133 and 113 are formed from titanium nitride, tungsten, or the like. Then a TiN thin film and a tungsten thin film are formed by evaporation. A wiring pattern is formed by photolithography and RIE (reactive ion etching) to obtain a local writing bit line 1004 and a local reading bit line 1005 (at this point, the state of FIG. 5B is reached). Thereafter, an additional interlayer insulating film and a multilayer interconnection composed of an Al film, a copper film or the like are formed as needed and, lastly, a passivation film is formed.

The features of this embodiment are (1) that the third semiconductor region and the first semiconductor region are insulated by the insulating film 406 formed on the side face of the crystal thin film that is obtained by selective epitaxial growth and (2) that the gate threshold voltage for inducing carriers of the opposite type differs between in the first channel formation semiconductor thin film portion [to] and in the opposite conductivity type carrier channel which leads to the first channel formation semiconductor thin film portion from the third semiconductor region.

Since the opposite conductivity type carrier channel which leads to the first channel formation semiconductor thin film portion from the third semiconductor region crosses the high impurity concentration region 105 in contact with the third semiconductor region, the impurity concentration of the second channel formation thin film portion differs from that of the first channel formation thin film portion. Thus, the gate threshold voltage which induces the carriers of the opposite conductivity type differs between in the first channel formation thin film portion and in the opposite conductivity type carrier channel which leads to the first channel formation semiconductor thin film portion from the third semiconductor region.

If a barrier against carriers of the opposite conductivity type is formed between the first channel formation semiconductor thin film portion and the third semiconductor region as described above, it reduces the amount of opposite conductivity type carriers pushed back to the third semiconductor region upon reading where a voltage in the direction that induces carriers of the first conductivity type is applied to the first conductive gate. Therefore reading can be carried out without fear of erasing the stored information.

In the embodiment illustrated in FIGS. 5A and 5B, the first semiconductor regions of cells arranged in the column direction are connected to the reading bit line 1005 and the third semiconductor regions of these cells are connected to the writing bit line 1004. The first and second common conductive gates of cells arranged in the row direction are connected to the word line 1001. The second semiconductor regions of the cells arranged in the row direction are connected to the common line 1003. The reading bit line and the writing bit line extend in the column direction whereas the word line and the common line extends in the row direction. Arrangement of cells and the vertical and horizontal relation of the bit line and the word line can be interchanged without causing any problem.

A description is given below on the operation of a single cell that is manufactured in accordance with the above embodiment. Data is written in this cell by setting the electric potential of the second conductive gate with respect to the electric potential of the third semiconductor region to a level that exceeds the threshold voltage $Vth_{r2}$ of the opposite conductivity type carrier channel below the second conductive gate.

In the cell manufactured by the above manufacture process, $Vth_{r2}$ is about −0.5 V when the electric potential of the second semiconductor region is 0 V and therefore it is desirable to set the electric potential of the third semiconductor region to 0.2 to 0.3 V while setting the second conductive gate to −0.3 to −0.4 V. To keep data, setting the first conductive gate to 0 to 0.2 V and giving the first semiconductor region the same electric potential as the second semiconductor region are desirable.

To erase data, the second semiconductor region is set to −0.6 V or lower (when the electric potential of the first semiconductor region is 0 V and the first conductive gate is 0 V), or the electric potential of the third semiconductor region is set to 0 to −0.4 V and the electric potential of the second conductive gate is set to −0.55 V or lower. In this way, opposite conductivity type carriers holes) stored in the first channel formation semiconductor thin film portion are drawn into the second semiconductor region or into the third semiconductor region.

To read data, whether the current flowing between the first and second semiconductor regions is large or small is detected by applying, to the first conductive gate, a voltage about the first conductivity type carrier gate threshold voltage $Vth_{10}$ (0.2 V larger at most) of the first conductive gate in the cell whose data has been erased. In the case of multi-valued storing, a voltage between $Vth_{10}$ and $Vth_{11}$, a voltage between $Vth_{11}$ and $Vth_{12}$, a voltage between $Vth_{12}$ and $Vth_{13}$ ... are applied to the first conductive gate to detect stored information. A voltage applied between the first and second semiconductor regions is from 0.2 V to 0.9 V. The intermediate current value between the current of a cell to which data is written and the current of a cell from which data is erased is taken to serve as a reference value. In the case where a voltage between one stored threshold voltage and another stored threshold voltage is applied to the first conductive gate, information is judged from the presence or absence of the cell current.

In order to prevent writing error (erasing and reading error also) caused by opposite polarity carriers generated in the high electric field region of the first channel formation semiconductor thin film portion, it is safer to avoid applying a voltage equal to or larger than the energy gap value of the semiconductor thin film which is converted into voltage in the unit (1.1 V if the film is silicon) between the first and second semiconductor regions.

Figure 7:
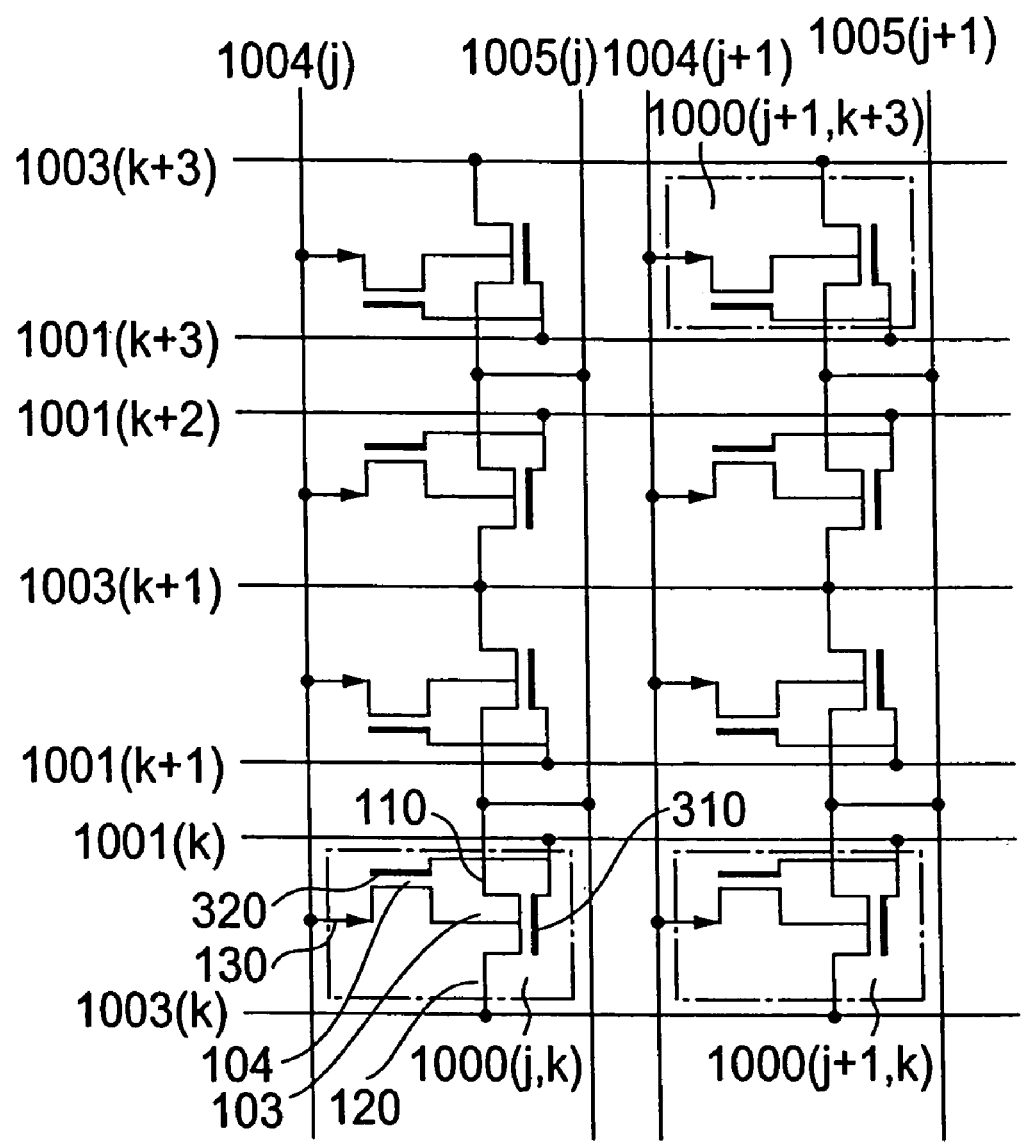
FIG. 7 is an equivalent circuit diagram of the memory cell array shown in FIGS. 5A and 5B.

In Embodiment 1, cells of the present invention in FIGS. 5A and 5B are connected as shown in an equivalent circuit diagram of FIG. 7 to obtain a memory array. The memory array is operated by combination of voltages shown in Table 1 below. This array is suitable as a memory for a specific use because data can be written in cells of a word while data is read from cells of another word. The array is also suited for high speed refreshing operation. Table 1 shows the voltage relation among the word line, the writing bit line, the reading bit line, and the common line when the array is operated by a single polarity power supply of 1.2 V. Operation on a single polarity power supply is made possible by biasing the common line at a positive electric potential, usually, 0.5 V.

(one bit line doubles as a writing bit line and a reading bit line different from the case in the memory array of FIGS. 5A and 5B).

Figure 8:
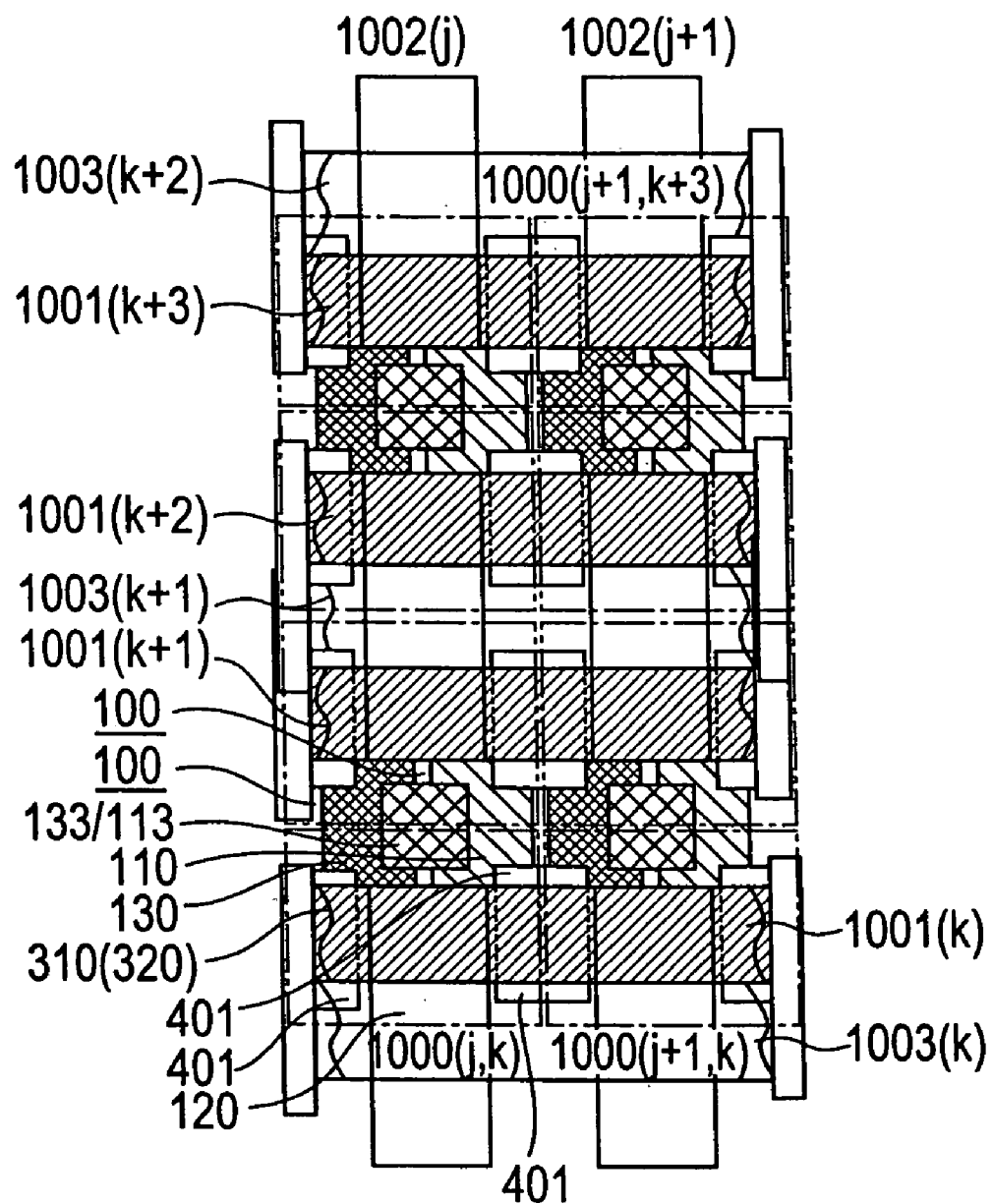
FIG. 8 is a plan view of memory cells and array in which a writing bit line and a reading bit line are shared.

This array structure makes it possible to reduce the array area. FIG. 8 is a plan view of memory cells used in this array connection and the cell area thereof is $6F^2$ to $4F^2$. To achieve a cell area of $4F^2$, a self-alignment contact technique is needed.

The cell arrangement in the array of FIG. 8 is similar to the one in FIGS. 5A and 5B; the conductive gates in one cell are above the first, second, and third semiconductor regions and this positional relation is reversed in every other cell in the longitudinal direction while the first, second, and third semiconductor regions in one cell are continuous with those in its adjacent cells in the column direction. For instance, the first and third semiconductor regions of the k-th cell in the column direction are continuous with those in the (K+1)-th cell. The second semiconductor region of the j-th cell is

TABLE 1

Operation Voltage Example of a Memory Array according to Embodiment 1 of the Present Invention

| | Selected cell voltage (V) | | | | Non-selected cell voltage (V) | | | | | | |
|---|---|---|---|---|---|---|---|---|---|---|---|
| | | | | | Writing | | Erasing | | Reading | | [Keeping] |
| | Writing | Erasing | Reading | Retention | CW | CB | CW | CB | CW | CB | Retention |
| Word line | 0.1 | 0 | 1.2 | 0.5 | 0.1 | 0.5 | 0 | 0.5 | 1.2 | 0.5 | 0.5 |
| Writing bit line | 0.7 | 0 | 0.5 | 0.5 | 0.5 | 0.7 | 0 | 0 | 0.5 | 0.5 | 0.5 |
| Reading bit line | 0.5 | 0.5 | 0.8 | 0.5 | 0.5 | 0.5 | 0.5 | 0.5 | 0.5 | 0.8 | 0.5 |
| Common line | 0.5 | 0.5 | 0.5 | 0.5 | 0.5 | 0.5 | 0.5 | 0.5 | 0.5 | 0.5 | 0.5 |

CW (common word): cells sharing a word line
CB (common bit): cells sharing a bit line In the operation shown in Table 1, data is erased from all cells that are connected to the same word line upon erasing. An acceptable change in voltage of one line is within ±0.1 V when the voltage of another line has the standard value. If the voltage of every line is changed in the same direction, the acceptable electric potential change is larger.

It is sufficient if the difference between the electric potential of each line and the electric potential of the common line satisfies the relation shown in Table 1. Accordingly, it may also be expressed as Table 2.

TABLE 2

Relative Expression of Operation Voltage Example of a Memory Array according to Embodiment 1 of the Present Invention

| | Selected cell voltage (V) | | | |
|---|---|---|---|---|
| | Writing | Erasing | Reading | Retention |
| Word line | Common line electric potential −0.4 | Common line electric potential −0.5 | Common line electric potential +0.7 | Common line electric potential |
| Writing bit line | Common line electric potential +0.2 | Common line electric potential | Common line electric potential | Common line electric potential |
| Reading bit line | Common line electric potential | Common line electric potential | Common line electric potential +0.3 | Common line electric potential |

According to the array structure for memory cells of the present invention, the third semiconductor region and the first semiconductor region are connected to the same bit line continuous with that of the (j+1)-th cell. The first semiconductor region in one cell and the first semiconductor region in a cell adjacent to the one cell in the word direction are electrically insulated from each other by the third semiconductor region of their adjacent cell when biased with a backward bias and a slight forward voltage.

The semiconductor thin film 100 extending in the word direction which includes the first semiconductor region and the third semiconductor region is physically continuous. On the other hand, in the example shown in FIGS. 5A and 5B, the first semiconductor regions in adjacent cells in the word direction are separated by an insulating film. However, if the distance between the writing bit line and the reading bit line is narrowed by, for example, forming the two bit lines from different interconnection layers. FIGS. 5A and 5B can also take a structure in which the semiconductor thin film is continuous on the first semiconductor region side too and the adjacent first semiconductor regions are electrically insolated by the third semiconductor region.

In any case, the first channel formation semiconductor thin film portion or the second channel formation semiconductor thin film portion of one cell is separated from that of a cell adjacent to the one cell in the word direction.

In the plan view of FIG. 8 also, the first conductive gate and the second conductive gate are continuous and are further continued to the first or second conductive gate of a cell adjacent in the row direction. The gate has a series resistance component and therefore limits the operation speed. To improve this, a metal wire is used as a main word line and is connected to the conductive gates of a group of cells for example, 32 to 512 cells form one group) before the series resistance reaches the limit value.

Figure 9:
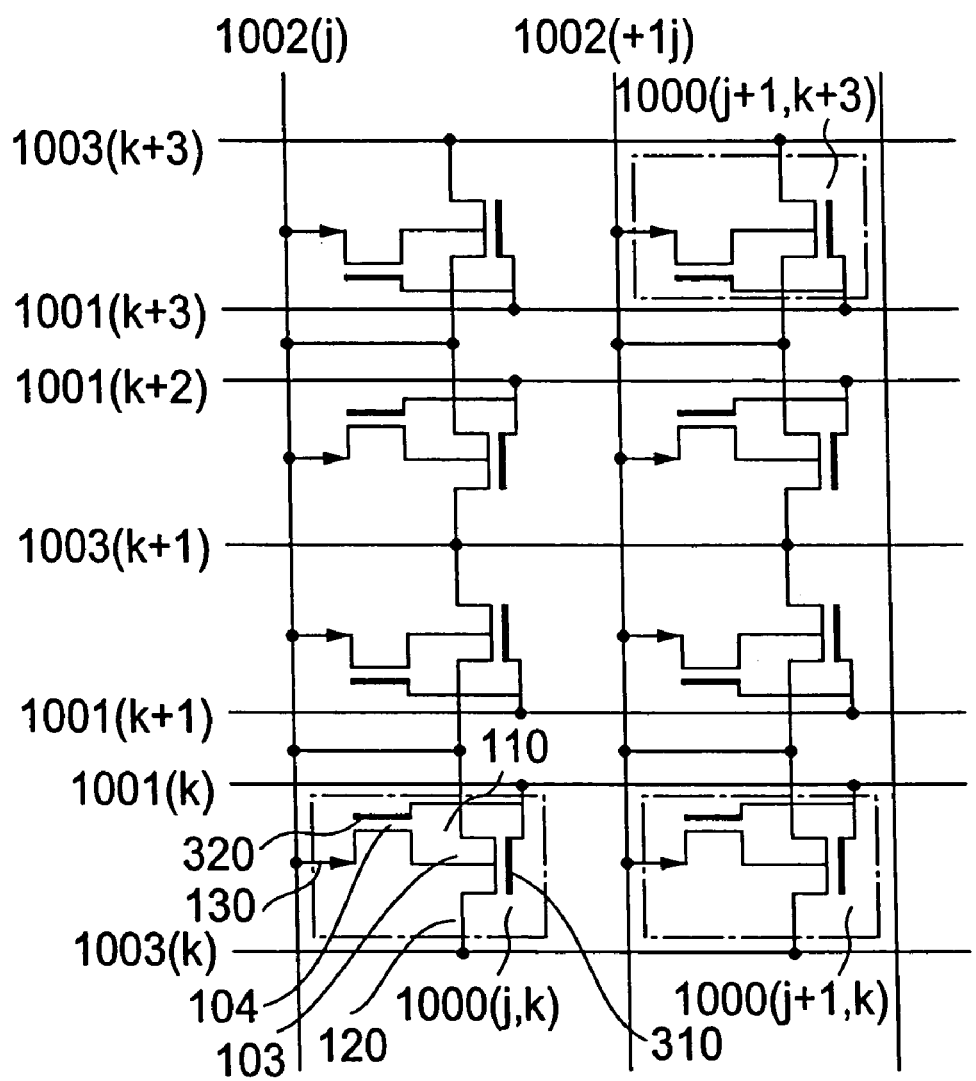
FIG. 9 is an equivalent circuit diagram of the memory cell array of FIG. 8.

In Embodiment 2, cells of the present invention in FIG. 8 are connected as shown in an equivalent circuit diagram of FIG. 9 to obtain a memory array. The memory array of Embodiment 2 is operated by combination of voltages shown in Table 3 below.

Table 3 shows an example of the voltage relation among the word line, the bit line, and the common line when the array is operated by a single polarity power supply of 1 V. Operation on a single polarity power supply is made possible by biasing the common line at a positive electric potential, usually, 0.3 V.

TABLE 3

Operation Voltage Example of a Memory Array according to Embodiment 2 of the Present Invention

|  | Selected cell voltage (V) | | | | Non-selected cell voltage (V) | | | | | | |
|---|---|---|---|---|---|---|---|---|---|---|---|
|  | Writing | | Reading | Retention | Writing (CW) | | Writing (CB) | | Reading | | Retention |
|  | "1" | "0" |  |  | "1" | "0" | "1" | "0" | CW | CB |  |
| Word line | 0 | 0 | 1.0 (in advance) | 0.3 | 0 | 0 | 0.3 | 0.3 | 1.0 | 0.3 | 0.3 |
| Bit line | 0.6 | 0 | 0.5 | 0.3 | 0.3 | 0.3 | 0.6 | 0 | 0.3 | 0.5 | 0.3 |
| Common line | 0.3 | 0.3 | 0.3 | 0.3 | 0.3 | 0.3 | 0.3 | 0.3 | 0.3 | 0.3 | 0.3 |

CW (common word): cells sharing a word line
CB (common bit): cells sharing a bit line The word line voltage upon reading is supplied before the bit line voltage.

An acceptable change in voltage of one line is within ±0.1 V when the voltage of another line has the standard value. If the voltage of every line is changed in the same direction, the acceptable electric potential change is larger.

It is sufficient if the difference between the electric potential of each line and the electric potential of the common line satisfies the relation shown in Table 3. Accordingly, it may also be expressed as Table 4.

TABLE 4

Relative Expression of Operation Voltage Example of a Memory Array according to Embodiment 2 of the Present Invention

|  | Selected cell voltage (V) | | | |
|---|---|---|---|---|
|  | Writing | | Reading | Retention |
|  | "1" | "0" |  |  |
| Word line | Common line electric potential −0.3 | Common line electric potential −0.3 | Common line electric potential +0.7 (in advance) | Common line electric potential |
| Bit line | Common line electric potential +0.3 | Common line electric potential −0.3 | Common line electric potential +0.2 | Common line electric potential |

In the present invention, the semiconductor thin film may be a silicon germanium single crystal thin film or a strained silicon/silicon germanium laminate other than a silicon single crystal thin film. The gate insulating film may be a silicon oxynitride film, a silicon nitride film, an alumina film, a hafnium oxide film, a film of a silicon—hafnium oxide mixture, a zirconium oxide film, or a film of a silicon—zirconium oxide mixture other than a silicon oxide film. The conductive gates may be a tungsten film, a titanium nitride film, or a titanium/titanium nitride laminate other than a polysilicon film or a silicon germanium film. The first, second, and third semiconductor regions may be formed not only in the semiconductor thin film but also on top of the semiconductor thin film, and a metal silicide film or a metal thin film may be added thereon to form a laminate. Thus the present invention can be carried out within a modification range which comes easy to the skilled in the art.

The first, second, and third semiconductor regions are described in this specification as "being in contact with" the semiconductor thin film. This contact state is obtained either by introducing impurity atoms into the semiconductor thin film and forming the first, second, and third semiconductor regions in the film or by forming the first, second, and third semiconductor regions on the semiconductor thin film by deposition.

The present invention may employ a structure for capacitance coupling of the second principal surface or the side face to the first channel formation semiconductor thin film portion, so that data stored is kept longer and the amount of opposite conductivity type carriers stored is increased.

The present invention is applicable to both PDSOI and FDSOI and, when applied to FDSOI, the present invention can provide effects that have been difficult to attain in prior art.

The present invention can provide a memory cell having the FDSOIMOS structure and the FDSONMIS structure as well as the PDSOIMIS structure, and a memory array using the memory cell. The memory cell does not need a large capacitor.

The memory can be mounted together with FDSOI logic that is capable of low power operation, and the operation voltage of the memory is in a range that matches the range of the low power logic.

If the cell takes a so-called double gate MIS structure, carriers of the opposite conductivity type are securely stored in the memory cell by the electric potential given to the third conductive gate of the cell.

What is claimed is:

1. A thin film memory cell comprising:
   a semiconductor thin film having a first principal surface and a second principal surface opposite the first principal surface;
   a first gate insulating film formed on the first principal surface of the semiconductor thin film;
   a first conductive gate formed on the first gate insulating film;

a first semiconductor region and a second semiconductor region which are spaced apart from each other across the first conductive gate, which are insulated from the first conductive gate, which are in contact with the semiconductor thin film, and which have a first conductivity type; and a third semiconductor region having a conductivity type opposite to the first conductivity type and disposed in contact with the semiconductor thin film;

wherein the semiconductor thin film has a combination of a thickness and an impurity concentration that depletion of carriers is caused between the first principal surface and the second principal surface between the first and second semiconductor regions below the first conductive gate under an electric potential of the first conductive gate;

wherein a portion of the semiconductor thin film that is sandwiched between the first semiconductor region and the second semiconductor region forms a first channel formation semiconductor thin film portion;

wherein the semiconductor thin film is extended between the first channel formation semiconductor thin film portion and the third semiconductor region to form a second channel formation semiconductor thin film portion which is in direct contact with the first channel formation semiconductor thin film portion;

wherein a second gate insulating film is formed on the extended portion of the semiconductor thin film and a second conductive gate is formed on the second gate insulating film; and wherein the first conductive gate and the second conductive gate overlap each other and are insulated from each other by an intergate insulator.

2. A thin film memory cell according to claim 1, wherein the first conductive gate and the second conductive gate are continuous with each other.

3. A thin film memory cell according to claim 1, wherein the second gate insulating film is continuous with the first gate insulating film and the second conductive gate is continuous with the first conductive gate.

4. A thin film memory cell according to claim 1, wherein the extended portion of the semiconductor thin film has a portion whose impurity concentration is different from the impurity concentration of the semiconductor thin film portion that is sandwiched between the first and second semiconductor regions.

5. A thin film memory cell according to claim 1, wherein the extended portion of the semiconductor thin film has an impurity portion whose conductivity type is different from the conductivity type of the semiconductor thin film portion that is sandwiched between the first and second semiconductor regions.

6. A thin film memory cell according to claim 1, wherein the semiconductor thin film is formed on an insulating substrate.

7. A thin film memory cell according to claim 1, wherein at least one end of the semiconductor thin film is supported by a substrate.

8. A thin film memory array comprising:
a plurality of word lines;
a plurality of writing bit lines that are insulated from and intersect the word lines;
a plurality of reading bit lines running by the side of the writing bit lines;
a plurality of common lines; and
a plurality of memory cells according to claim 1;

wherein, in a portion where one of the plural word lines intersects one of the plural writing bit lines and one of the plural reading bit lines that runs along the one writing bit line, the first and the second conductive gates of one of the plural memory cells are connected to the one word line;

wherein the first semiconductor region of the one memory cell is connected to the one reading bit line; wherein the second semiconductor region of the one memory cell is connected to one of the plural common lines; and wherein the third semiconductor region of the one memory cell is connected to the one writing bit line.

9. A thin film memory array according to claim 8,
wherein the first conductive gate and the second conductive gate are continuous throughout one cell and are continued further to extend between cells adjacent in the word direction to form a part of a word line, and wherein one out of the first channel formation semiconductor thin film portion and the second channel formation semiconductor thin film portion in one cell is separated from that of its adjacent cell.

10. A thin film memory array according to claim 9, wherein the memory cells are arranged such that the first semiconductor regions and the second semiconductor regions of adjacent memory cells form a mirror image relation to build an array of memory cells, and wherein the first and third semiconductor regions are continued from one of the memory cells to its adjacent memory cell in a first direction and the second semiconductor region is continued from one of the memory cells to its adjacent memory cell in a second direction different from the first direction.

11. A thin film memory array according to claim 8, wherein a part of the common lines is formed from a continuous second semiconductor region extending over adjacent cells.

12. A thin film memory array according to claim 8,
wherein the semiconductor thin film is continuous in the word line direction, and wherein the first semiconductor region of one of the memory cells is electrically isolated from the first semiconductor region of its adjacent memory cell by the third semiconductor region.

13. An operation method for a thin film memory array according to claim 8, comprising the steps of:
during writing, setting a word line electric potential to a value obtained by subtracting 0.4 V (±0.1 V) from a common line electric potential, setting a writing bit line electric potential to a value obtained by adding 0.2 V (±0.1 V) to the common electric potential, a reading bit line electric potential being the common electric potential;

during erasing, setting the word line electric potential to a value obtained by subtracting 0.5 V (±0.1 V) from the common line electric potential, each of a writing bit line electric potential and a reading bit line electric potential being the common electric potential; and during reading, setting the word line electric potential to a value obtained by adding 0.7 V (±0.1 V) to the common line electric potential, a writing bit line electric potential being the common electric potential, and setting the reading bit line electric potential to a value obtained by adding 0.3 V (±0.1 V) to the common electric potential.

14. A method of manufacturing a thin film memory array according to claim 8, comprising the steps of:

forming the third semiconductor region by selective crystal growth;

oxidizing at least a side face of the third semiconductor region that has been formed by selective crystal growth; and forming the first semiconductor region by selective epitaxial growth.

15. A thin film memory array comprising:
a plurality of word lines;
a plurality of bit lines that are insulated from and intersect the word lines;
a plurality of common lines; and
a plurality of memory cells according to claim 1;
wherein, in a portion where one of the plural word lines and one of the plural bit lines intersect one another, the first and second conductive gates of one of the plural memory cells are connected to the one word line;
wherein the first semiconductor region and the third semiconductor region of the one memory cell is connected to the one bit line; and
wherein the second semiconductor region of the one memory cell is connected to one of the plural common lines.

16. A thin film memory array according to claim 15, wherein the first conductive gate and the second conductive gate are continuous throughout one cell and are continued further to extend between cells adjacent in a word direction to form a part of the one word line, and wherein one out of the first channel formation semiconductor thin film portion and the second channel formation semiconductor thin film portion in the one cell is separated from that of its adjacent cell.

17. A thin film memory array according to claim 16, wherein the memory cells are arranged such that the first semiconductor regions and the second semiconductor regions of adjacent memory cells form a mirror image relation to build an array of memory cells, and
wherein the first and third semiconductor regions are continued from one of the memory cells to its adjacent memory cell in a first direction and the second semiconductor region is continued from one of the memory cells to its adjacent memory cell in a second direction different from the first direction.

18. A thin film memory array according to claim 15, wherein a part of the common lines is formed from a continuous second semiconductor region extending over adjacent cells.

19. A thin film memory array according to claim 15,
wherein the semiconductor thin film is continuous in the word line direction, and
wherein the first semiconductor region of one of the memory cells is electrically isolated from the first semiconductor region of its adjacent memory cell by the third semiconductor region.

20. An operation method for a thin film memory array according to claim 15, comprising the steps of:
during writing, setting the word line electric potential to a value obtained by subtracting 0.3 V (±0.1 V) from a common line electric potential, setting a "1" writing bit line electric potential to a value obtained by adding 0.3 V (±0.1 V) to the common electric potential, and setting a "0" writing bit line electric potential to a value obtained by subtracting 0.3 V (±0.1 V) from the common electric potential; and
during reading, setting the word line electric potential to a value obtained by adding 0.7 V (±0.1 V) to the common line electric potential and setting the bit line electric potential to a value obtained by adding 0.2 V (±0.1 V) to the common electric potential.

21. A method of manufacturing a thin film memory array according to claim 15, comprising the steps of:
forming the third semiconductor region by selective crystal growth;
oxidizing at least a side face of the third semiconductor region that has been formed by selective crystal growth; and
forming the first semiconductor region by selective epitaxial growth.

22. A writing method for a thin film memory cell according to claim 1, comprising the steps of:
obtaining an electric potential difference value by subtracting the electric potential of the third semiconductor region from the electric potential of the second conductive gate, and setting the obtained electric potential difference value to a level exceeding a gate threshold voltage $Vth_{2,r}$ of a channel that is induced in the second channel formation semiconductor thin film portion to deliver opposite conductivity type carriers from the third semiconductor region which is viewed from the second conductive gate,
wherein as a result of the setting step, carriers of the opposite conductivity type are injected from the third semiconductor region through the second channel formation semiconductor thin film portion into the first channel formation semiconductor thin film portion, so that the gate threshold voltage of a first conductivity type channel in the first channel formation semiconductor thin film portion which is viewed from the first conductive gate is changed to a first value.

23. A writing method for a thin film memory cell according to claim 1, comprising the steps of: obtaining an electric potential difference value by subtracting the electric potential of the third semiconductor region from the electric potential of the second conductive gate, setting the obtained electric potential difference value to a level sufficiently exceeding a gate threshold voltage of a channel that is induced in the second channel formation semiconductor thin film portion to deliver opposite conductivity type carriers from the third semiconductor region which is viewed from the second conductive gate, and setting the electric potential of the third semiconductor region with respect to the electric potential of the second conductive gate to a multilevel value so that a first value of the gate threshold voltage is multilevel.

24. An erasing method for thin film memory cell according to claim 1, comprising the steps of:
obtaining an electric potential difference value by subtracting, from the electric potential of the second conductive gate, the electric potential of the opposite conductivity type carriers injected into the first channel formation semiconductor thin film portion, and setting the obtained electric potential difference value to a level exceeding a gate threshold voltage of all opposite conductivity type channel in the second channel formation semiconductor thin film portion which is viewed from the second conductive gate,
wherein as a result of the setting step, carriers of the opposite conductivity type are drawn from the first channel formation semiconductor thin film portion into the third semiconductor region, so that the gate threshold voltage of a first conductivity type channel in the first channel formation semiconductor thin film portion which is viewed from the first conductive gate is changed to a second value.

25. An erasing method for a thin film memory cell according to claim 1, comprising the step of: applying an electric potential to the first semiconductor region in a direction that draws carriers of the opposite conductivity type to the first semiconductor region.

26. An erasing method for a thin film memory cell according to claim 1, comprising the step of: applying an electric potential to the second semiconductor region in a direction that draws carriers of the opposite conductivity type to the second semiconductor region.

27. An operation method for to a thin film memory cell according to claim 1, comprising the steps of:
obtaining an electric potential value by subtracting the electric potential of the third semiconductor region from the electric potential of the second conductive gate, and setting the obtained electric potential value to a level exceeding a gate threshold voltage of a channel that is induced in the second channel formation semiconductor thin film portion to deliver opposite conductivity type carriers from the third semiconductor region which is viewed from the second conductive gate,
wherein a first gate threshold voltage is written when the electric potential of the third semiconductor region is forward-biased with respect to the electric potential of the second semiconductor region, and
wherein a second gate threshold voltage is written when the electric potential of the third semiconductor region is zero-biased or reverse-biased with respect to the same second gate voltage.

28. A reading method for a thin film memory cell according to claim 1, comprising the steps of: setting the voltage of the first conductive gate with respect to the second semiconductor region to a prescribed value that exceeds one or both of a first gate threshold voltage and a second gate threshold voltage, and detecting whether a current flowing between the first semiconductor region and the second semiconductor region is large or small to judge stored information.

29. A reading method according to claim 28, wherein a voltage applied between the first and second semiconductor regions does not exceed a value equal to an energy gap of the semiconductor thin film which is converted into a voltage in the thin film memory cell.

30. A method of manufacturing a thin film memory cell according to claim 1, comprising the steps of:
forming the third semiconductor region by selective crystal growth;
oxidizing at least a side face of the third semiconductor region that has been formed by selective crystal growth; and
forming the first semiconductor region by selective epitaxial growth.

31. A thin film memory cell comprising:
a semiconductor thin film having a first principal surface and a second principal surface opposite to the first principal surface;
a first gate insulating film formed on the first principal surface of the semiconductor thin film;
a first conductive gate formed on the first gate insulating film;
a first semiconductor region and a second semiconductor region which are spaced apart from each other across the first conductive gate, which are insulated from the first conductive gate, which are in contact with the semiconductor thin film, and which have a first conductivity type; and
a third semiconductor region having a conductivity type opposite to the first conductivity type and disposed in contact with the semiconductor thin film in a part of area below the first conductive gate;
wherein the semiconductor thin film has a combination of a thickness and an impurity concentration that depletion of carriers is caused between the first principal surface and the second principal surface between the first and second semiconductor regions below the first conductive gate under an electric potential of the first conductive gate;
wherein a portion of the semiconductor thin film that is sandwiched between the first semiconductor region and the second semiconductor region forms a first channel formation semiconductor thin film portion; and
wherein the semiconductor thin film is extended between the first channel formation semiconductor thin film portion and the third semiconductor region to form a second channel formation semiconductor thin film portion.

32. A thin film memory cell according to claim 31, wherein the second channel formation semiconductor thin film portion has a portion whose impurity concentration is different from the impurity concentration of the first channel formation semiconductor thin film portion.

33. A thin film memory cell according to claim 31, wherein the second channel formation semiconductor thin film portion has an impurity portion whose conductivity type is different from the conductivity type of the first channel formation semiconductor thin film portion.

34. A thin film memory array comprising:
a plurality of word lines;
a plurality of writing bit lines that are insulated from and intersect the word lines;
a plurality of reading bit lines running by the side of the writing bit lines;
a plurality of common lines; and a plurality of memory cells according to claim 31;
wherein, in a portion where one of the plural word lines intersects one of the plural writing bit lines and one of the plural reading bit lines that runs along the one writing bit line, the first conductive gate of one of the plural memory cells is connected to the one word line;
wherein the first semiconductor region of the one memory cell is connected to the one reading bit line;
wherein the second semiconductor region of the one memory cell is connected to one of the plural common lines; and
wherein the third semiconductor region of the one memory cell is connected to the one writing bit line.

35. An operation method for a thin film memory array according to claim 34, comprising the steps of:
during writing, setting a word line electric potential to a value obtained by subtracting 0.4 V (±0.1 V) from a common line electric potential, and setting a writing bit line electric potential to a value obtained by adding 0.2 V (±0.1 V) to the common line electric potential, a reading bit line electric potential being the common electric potential,
during erasing, setting the word line electric potential to a value obtained by subtracting 0.5 V (±0.1 V) from the common line electric potential, each of a writing bit line electric potential and a reading bit line electric potential being the common electric potential; and
during reading, setting the word line electric potential to a value obtained by adding 0.7 V (±0.1 V) to the common line electric potential, a writing bit line electric potential being the common electric potential, and setting the reading bit line electric potential to a value obtained by adding 0.3 V (±0.1 V) to the common electric potential.

36. A thin film memory array according to claim 34, wherein the first conductive gate is extended to be continuous between cells adjacent in the word direction and forms a part of a word line, and wherein one out of the first channel formation semiconductor thin film portion and the second channel formation semiconductor thin film portion in one cell is separated from that of its adjacent cell.

37. A thin film memory array according to claim 36, wherein the memory cells are arranged such that the first semiconductor regions and the second semiconductor regions of adjacent memory cells form a mirror image relation to build an array of memory cells, and wherein the first and third semiconductor regions are continued from one of the memory cells to its adjacent memory cell in a first direction and the second semiconductor region is continued from one of the memory cells to its adjacent memory cell in a second direction different from the first direction.

38. A thin film memory array according to claim 34, wherein a part of the common lines is formed from a continuous second semiconductor region extending over adjacent cells.

39. A thin film memory array according to claim 34, wherein the semiconductor thin film is continuous in the word line direction, and wherein the first semiconductor region of one of the memory cells is electrically isolated from the first semiconductor region of its adjacent memory cell by the third semiconductor region.

40. A method of manufacturing a thin film memory array according to claim 34, comprising the steps of:

forming the third semiconductor region by selective crystal growth;

oxidizing at least a side face of the third semiconductor region that has been formed by selective crystal growth; and forming the first semiconductor region by selective epitaxial growth.

41. A thin film memory array comprising:
a plurality of word lines;
a plurality of bit lines that are insulated from and intersect the word lines;
a plurality of common lines; and
a plurality of memory cells according to claim 31;
wherein, in a portion where one of the plural word lines and one of the plural bit lines intersect one another, the first conductive gate of one of the plural memory cells is connected to the one word line;
wherein the first semiconductor region and the third semiconductor region of the one memory cell is connected to the one bit line; and
wherein the second semiconductor region of the one memory cell is connected to one of the plural common lines.

42. A thin film memory array according to claim 41, wherein the first conductive gate is extended to be continuous between cells adjacent in a word direction and forms a part of the one word line, and wherein one out of the first channel formation semiconductor thin film portion and second channel formation semiconductor thin film portion in one cell is separated from that of its adjacent cell.

43. A thin film memory array according to claim 42, wherein the cells are arranged such that the first semiconductor regions and the second semiconductor regions of adjacent cells form a mirror image relation to build an array, and wherein the first and third semiconductor regions are continued from a cell to its adjacent cell in one direction whereas the second semiconductor region is continued from a cell to its adjacent cell in the other direction.

44. A thin film memory array according to claim 41, wherein a part of the common lines is formed from a continuous second semiconductor region extending over adjacent cells.

45. A thin film memory array according to claim 41, wherein the semiconductor thin film is continuous in the word line direction, and wherein the first semiconductor region of one cell is electrically insulated from the first semiconductor region of its adjacent cell by the third semiconductor region.

46. An operation method for to a thin film memory array according to claim 41, comprising the steps of:

during writing, setting a word line electric potential to a value obtained by subtracting 0.3 V (±0.1 V) from the common line electric potential, setting a "1" writing bit line electric potential to a value obtained by adding 0.3 (±0.1 V) to the common electric potential, and setting a "0" writing bit line electric potential to a value obtained by subtracting 0.3 V (±0.1 V) from the common electric potential; and during reading, setting the word line electric potential to a value obtained by adding 0.7 V (±0.1 V) to the common line electric potential, and setting the bit line electric potential to a value obtained by adding 0.2 V (±0.1 V) to the common electric potential.

47. A method of manufacturing a thin film memory array according to claim 41, comprising the steps of:

forming the third semiconductor region through selective crystal growth;

oxidizing at least a side face of the third semiconductor region that has been formed by selective crystal growth; and forming the first semiconductor region through selective epitaxial growth.

48. A writing method for a thin film memory cell according to claim 31, comprising the steps of:

obtaining an electric potential difference value by subtracting the electric potential of the third semiconductor region from the electric potential of the first conductive gate, and setting the obtained electric potential difference value to a level exceeding a gate threshold voltage $Vth_{2r}$ of a channel that is induced in the second channel formation semiconductor thin film portion to deliver opposite conductivity type carriers from the third semiconductor region which is viewed from the first conductive gate, wherein as a result of the setting step, carriers of the opposite conductivity type are injected from the third semiconductor region through the second channel formation semiconductor thin film portion into the first channel formation semiconductor thin film portion, so that the gate threshold voltage of a first conductivity type channel in the first channel formation semiconductor thin film portion which is viewed from the first conductive gate is changed to a first value.

49. An erasing method for a thin film memory cell according to claim 31, comprising the steps of:

obtaining an electric potential difference value by subtracting, from the electric potential of the first conductive gate, the electric potential of the opposite conductivity type carriers injected into the first channel formation semiconductor thin film portion, and setting the obtained electric potential difference value to a level exceeding a gate threshold voltage of all opposite conductivity type channel in the second channel formation semiconductor thin film portion which is viewed from the first conductive gate, wherein as a result of the setting step, carriers of the opposite conductivity type are drawn from the first channel formation semiconductor thin film portion into the third semiconductor region, so that the gate threshold voltage of a first conductivity type channel in the first channel formation semiconductor thin film portion which is viewed from the first conductive gate is changed to a second value.

50. An operation method for a thin film memory cell according to claim 31, comprising the steps of: obtaining an electric potential value by subtracting the electric potential of the third semiconductor region from the electric potential of the first conductive gate, and setting the obtained electric potential value to a level exceeding a gate threshold voltage of a channel that is induced in the second channel formation semiconductor thin film portion to deliver opposite conductivity type carriers from the third semiconductor region which is viewed from the first conductive gate, wherein a first gate threshold voltage is written when the electric potential of the third semiconductor region is forward-biased with respect to the electric potential of the second semiconductor region, and wherein a second gate threshold voltage is written when the electric potential of the third semiconductor region is zero-biased or reverse-biased with respect to the same second gate voltage.

51. A thin film memory cell according to claim 31, wherein the semiconductor thin film is formed on an insulating substrate.

52. A thin film memory cell according to claim 31, wherein at least one end of the semiconductor thin film is supported by a substrate.

53. A thin film memory cell according to claim 31, further comprising:
a third gate insulating film formed on the second principal surface in the portion where the semiconductor thin film is sandwiched between the first semiconductor region and the second semiconductor region; and
a third conductive gate disposed in contact with the third gate insulating film.

54. A thin film memory cell according to claim 53, wherein a surface portion of a substrate supporting the semiconductor thin film serves as the third conductive gate.

55. An erasing method for a thin film memory cell according to claim 31, comprising the step of: applying an electric potential to the first semiconductor region in a direction that draws carriers of the opposite conductivity type to the first semiconductor region.

56. An erasing method for a thin film memory cell according to claim 31, comprising the step of: applying an electric potential to the second semiconductor region in a direction that draws carriers of the opposite conductivity type to the second semiconductor region.

57. A reading method for a thin film memory cell according to claim 31, comprising the step of: setting a voltage of the first conductive gate with respect to the second semiconductor region to a prescribed value that exceeds one or both of a first gate threshold voltage and a second gate threshold voltage, and detecting whether a current flowing between the first semiconductor region and the second semiconductor region is large or small to judge stored information.

58. A reading method according to claim 57; wherein a voltage applied between the first and second semiconductor regions does not exceed a value equal to an energy gap of the semiconductor thin film which is converted into a voltage in the thin film memory cell.

59. A method of manufacturing a thin film memory cell according to claim 31, comprising the steps of:
forming the third semiconductor region by selective crystal growth;
oxidizing at least a side face of the third semiconductor region that has been formed by selective crystal growth; and
forming the first semiconductor region by selective epitaxial growth.

60. A thin film memory cell comprising:
a semiconductor thin film having a first principal surface and a second principal surface opposite the first principal surface;
a first gate insulating film formed on the first principal surface of the semiconductor thin film;
a first conductive gate formed on the first gate insulating film;
a first semiconductor region and a second semiconductor region which are spaced apart from each other across the first conductive gate, which are insulated from the first conductive gate, which are in contact with the semiconductor thin film, and which have a first conductivity type; and
a third semiconductor region which has an opposite conductivity type opposite to the first conductivity type and which is in contact with the semiconductor thin film;
wherein a portion of the semiconductor thin film that is sandwiched between the first semiconductor region and the second semiconductor region forms a first channel formation semiconductor thin film portion;
wherein the semiconductor thin film is extended between the first channel formation semiconductor thin film portion and the third semiconductor region of the opposite conductivity type to form a second channel formation semiconductor thin film portion;
wherein a second gate insulating film is formed on the extended portion of the semiconductor thin film and a second conductive gate is formed on the second gate insulating film;
wherein a third gate insulating film is formed on the second principal surface in the portion where the semiconductor thin film is sandwiched between the first semiconductor region and the second semiconductor region; and
wherein a third conductive gate is disposed in contact with the third gate insulating film.

61. A thin film memory cell according to claim 60, wherein a surface portion of a substrate supporting the semiconductor thin film serves as the third conductive gate.

* * * * *